United States Patent [19]
Aoshima

[11] Patent Number: 6,013,412
[45] Date of Patent: Jan. 11, 2000

[54] NEGATIVE TYPE IMAGE RECORDING MATERIAL

[75] Inventor: Keitaro Aoshima, Shizuoka-ken, Japan

[73] Assignee: Fuji Photo Film Co., Ltd., Minami-Ashigara, Japan

[21] Appl. No.: 09/030,424

[22] Filed: Feb. 25, 1998

[30] Foreign Application Priority Data

Mar. 26, 1997 [JP] Japan ................................. 9-073552

[51] Int. Cl.$^7$ ................................................. G03C 1/492
[52] U.S. Cl. ........................ 430/270.1; 430/302; 430/927
[58] Field of Search ................................ 430/284.1, 906, 430/926, 927, 157, 270.1, 300, 302; 101/453

[56] References Cited

U.S. PATENT DOCUMENTS

| | | | |
|---|---|---|---|
| 4,877,711 | 10/1989 | Aoai et al. | 430/176 |
| 4,983,491 | 1/1991 | Aoai et al. | 430/175 |
| 5,286,600 | 2/1994 | Ochiai et al. | 430/270 |
| 5,372,907 | 12/1994 | Haley et al. | 430/157 |
| 5,641,577 | 6/1997 | Naruse et al. | 428/460 |
| 5,658,708 | 8/1997 | Kondo | 430/288.1 |

FOREIGN PATENT DOCUMENTS

| | | |
|---|---|---|
| 420827 | 4/1991 | European Pat. Off. . |
| 613050 | 8/1994 | European Pat. Off. . |

*Primary Examiner*—Janet Baxter
*Assistant Examiner*—Rosemary Ashton
*Attorney, Agent, or Firm*—Burns, Doane, Swecker & Mathis, LLP

[57] ABSTRACT

The present invention provides a negative type image recording material comprising a polyurethane resin having a carboxyl group, a compound cross-linkable by an acid, and a compound generating an acid due to the application of heat or light.

Accordingly, a negative type image recording material can be provided which has excellent crosslinking properties with a crosslinking agent, and consequently, excellent layer strength and good printing durability, and which enables a direct plate making from digital data.

6 Claims, No Drawings

NEGATIVE TYPE IMAGE RECORDING MATERIAL

BACKGROUND OF THE INVENTION

1. Field of the Invention

The present invention relates to an image recording material which can be used as a planographic printing plate, color proof, photoresist and color filter. More particularly, the present invention relates to a negative type image recording material suitably used as a planographic printing plate which is capable of directly producing a printing plate by scanning the printing plate using an infrared laser based on digital signals output from a computer or the like.

2. Description of the Related Art

Conventionally, as systems for making a printing plate directly from digital computer data, there have been proposed (1) a system using an electrophotographic method; (2) a system using a photopolymerizable compound, which polymerizes by being exposed to a laser which emits blue or green light; (3) a system using a recording material in which a silver salt is laminated on a photosensitive resin; and (4) a system using a silver salt diffusion transfer method.3

However, the system using an electrophotographic method (1) above has complicated image formation processes such as charging, exposure, developing, and the like and therefore the apparatus thereof becomes sophisticated and large. In a system using a photopolymerizable compound (2) above, since a printing plate which is highly sensitive to blue or green light is used, it is difficult to handle in an illuminated room. In methods (3) and (4), since a silver salt is used, there are the disadvantages that processes such as developing and the like become complicated and the waste solution naturally contains silver.

In recent years, laser technologies have developed remarkably. In particular, high output and compact solid-state lasers and semiconductor lasers emitting infrared rays of a wavelength of 760 nm to 1,200 nm are readily available. These lasers are very useful as a light source for recording in the direct production of a printing plate from digital computer data. However, since most practical useful photosensitive recording materials are sensitive to visible light having a wavelength of 760 nm or less, image recording cannot be carried out with these infrared lasers. Therefore, a material recordable with an infrared laser is desired As an example of the image recording materials capable of recording images by the use of an infrared ray laser, a recording material comprising an onium salt, a phenol resin and a spectral sensitizing agent is disclosed in U.S. Pat. No. 4,708,925. However, the image recording material is a positive type recording material utilizing the dissolution prevention effect, generated by the onium salt and the phenol resin, with respect to the developer. On the other hand, examples of negative type image recording materials include a recording material comprising an onium salt, a resol resin, a novolak resin, and an infrared ray absorbing agent disclosed in U.S. Pat. No. 5,372,907. According to the image recording material, a positive image is obtained only with laser exposure, but by conducting a heat treatment after the laser exposure, a negative image can be obtained. In general, in order to obtain a negative image, coated layer should not remain on unexposed portions which are non-image portions, after developing. When the image recording material disclosed in U.S. Pat. No. 5,372,907 is heat treated after exposure under mild conditions, positive type characteristics By of the recording material become difficult to eliminate and coated layer tends to remain on the unexposed portions. Accordingly, a printing plate utilizing this type of image recording material suffers from the problem of staining at the time of printing. Furthermore, the printing plate using this type of image recording material lacks layer strength in the image portion and consequently printing durability at the time of printing is insufficient.

SUMMARY OF THE INVENTION

Accordingly, an object of the present invention is to provide a negative type image recording material capable of directly making a printing plate from digital data such as from a computer by the use of a solid state laser and a semiconductor laser emitting an infrared ray. Another object of the present invention is to provide a negative type image recording material with little residual coated layer on the non-image portion after recording an image, less generation of dirt at the time of printing, with an excellent layer strength of the recorded image to have a good printing durability at the time of printing.

The present inventors focused on to the constituents of negative type image recording materials and achieved the present invention after learning, as a result of earnest studies, that the above-mentioned objects can be achieved by using a polyurethane resin having a specific functional group as the binder.

Namely, the negative type image recording material of the present invention comprises (A) a polyurethane resin having a carboxyl group, (B) a compound crosslinkable by an acid (hereinafter referred to as "heat crosslinking agent"), and (C) a compound generating an acid by a light beam or heat (hereinafter referred to as "acid generating agent").

In the negative type image recording material of the present invention, the acid generating agent (C) degrades and generates an acid (at a portion irradiated with light or heat), the strong acid group thus generated facilitates the crosslinking reaction between the heat crosslinking agent (B) and the polyurethane resin having a carboxyl group (A) to record an image, namely, produce a printing plate. Since the polyurethane resin has a good crosslinking property with the crosslinking agent, it can form a firm coated layer so that the printing durability of the image recording material can be improved.

DETAILED DESCRIPTION OF THE PREFERRED EMBODIMENTS

Hereinafter the present invention will be explained in detail (A) polyurethane resins having a carboxyl group Examples of preferred polyurethane resins having a carboxyl group used in the present invention include a polyurethane resin having a primary skeleton obtained by the reaction of a diisocyanate compound represented by the following general formula (I), and a diol compound having a carboxyl group represented by the following general formula (II) or (III):

(I)

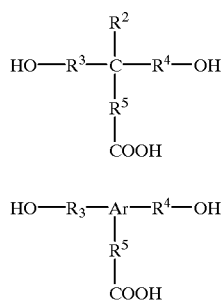

(II)

(III)

divalent aliphatic or aromatic hydrocarbon, which may be substituted. $R^1$ may include another functional group not reactive with an isocyanate group, such as an ester group, a urethane group, an amide group and a ureido group as needed.

$R^2$ represents a hydrogen atom an alkyl group, an aralkyl group, an aryl group, an alkoxy group, and an aryloxy group, which may be substituted. Preferably, $R^2$ is a hydrogen atom, an alkyl group having 1 to 8 carbon atoms, or an aryl group having 6 to 15 carbon atoms. $R^3$, $R^4$, $R^5$, which may be the same as or different from each other, each represent a divalent aliphatic or aromatic hydrocarbon, which may have a single bond or may be substituted. Preferably, $R^3$, $R^4$, $R^5$ are an alkylene group having 1 to 20 carbon atoms, or an arylene group having 6 to 15 carbon atoms. More preferably, $R^3$, $R^4$, $R^5$ are an alkylene group having 1 to 8 carbon atoms.

Among $R^2$, $R^3$, $R^4$, $R^5$ two or three may form a ring.

Ar represents a trivalent aromatic hydrocarbon, which may be substituted. Preferably, Ar is an aromatic group having 6 to 15 carbon atoms.

Concrete examples of diisocyanate compounds represented by the general formula (I) include aromatic diisocyanate compounds such as 2,4-tolylene diisocyanate, dimer of 2,4-trimethyl diisocyanate, 2,6-tolylene diisocyanate, p-xylylene diisocyanate, methaxylylene diisocyanate, 4,4'-diphenyl methane diisocyanate, 1,5-naphthylene diisocyanate, and 3,3'-dimethyl-biphenyl-4,4'-diisocyanate; aliphatic diisocyanate compounds such as hexamethylene diisocyanate, torymethyl hexamethylene diisocyanate, lysine diisocyanate, and dimeric acid diisocyanate; alicyclic diisocyanate compounds such as isopharone diisocyanate, 4,4'-methylene bis(cyclohexyl isocyanate), methylcyclohexane-2,4(or 2,6)-diisocyanate, and 1,3-(isocyanate methyl) cyclohexane; and diisocyanate compounds obtained by the reaction of diol and diisocyanate such as an adduct of 1 mole of1,3-butylene glycol and 2 moles of tolylene diisocyanate.

Concrete examples of diol compounds having a carboxyl group represented by the general formula (II) or (III) include 3,5-dihydroxybenzoic acid, 2,2-bis(hydroxymethyl) propionic acid, 2,2-bis(hydroxyethyl)propionic acid, 2,2-bis (3-hydroxypropyl)propionic acid, 2,2-bis(hydroxymethyl) acetic acid, bis-(4-hydroxyphenyl)acetic acid, 4,4-bis-(4-hydroxy phenyl)pentanoic acid, and tartaric acid.

The polyurethane resin of the present invention may be produced from a diisocyanate compound represented by the general formula (I) and two or more kinds of diol compounds having a carboxyl group represented by the general formulae (II) and (III).

Furthermore, a diol compound which, instead of having a carboxyl group, may have another substitute group not reactive with isocyanate, can be used as long as the alkaline developing properties are not diminished.

Concrete examples of the diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexane diol, 2-butene-1,4-diol, 2,2,4-trimethyl-1,3-pentane diol, 1,4-bis-β-hydroxyethoxy cyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F,propylene oxide adduct of bisphenol F, ethylene oxide adduct of hydrogenated bisphenol A, propylene oxide adduct of hydrogenated bisphenol A, hydroquinone dihydroxyethylether, p-xylylene glycol, dihydroxy ethylsulfone, bis-(2-hydroxy ethyl) 2,4-tolylene dicarbamate, 2,4-tolylene-bis-(2-hydroxy ethyl carbamide), bis-(2-hydroxyethyl)m-xylylene carbamate, and bis-(2-hydroxyethyl phthalate).

Polyurethane resins of the present invention can be synthesized by heating the above-mentioned diisocyanate compounds and diol compounds in a non-protonic solvent together with a catalyst of a known activity according to the reactivity of each compound. The molar ratio of the diisocyanate compound and the diol compound is preferably 0.8:1 to 1.2:1. In cases where an isocyanate group remains at the terminal end of the polymer the resins are treated with an alcohol, an amine, or the like to obtain a polyurethane resin with no remaining isocyanate group.

The weight average molecular weight of the polyurethane resin of the present invention is preferably 1,000 or more, more preferably from 5,000 to 100,000.

These polymer compounds can be used alone or in combination of two or more. The content of the polymer compounds used in image recording layers of negative type image recording materials is about 50 to 99.5% by weight, preferably about 55 to 95% by weight.

Another resin can be included in the negative type image recording material of the present invention of up to 50 parts by weight or less with respect to 100 parts by weight of the polymer. Examples of such a resin include polyamide resin, epoxy resin, polyacetal resin, acrylic resin, methacrylic resin, polystylene resin, and novolak type phenol resin.

(B) Heat cross-linking agent

A heat cross-linking agent preferably used in the present invention (hereinafter referred to as a cross-linking agent) is compound having, in a molecule, at least two groups, such as a hydroxymethyl group, alkoxymethyl group, epoxy group, and vinyl ether group. A heat cross-linking agent is preferably a compound in which these cross-linkable functional groups are directly bonded to an aromatic ring. Examples thereof include methylol melamine, resol resin, epoxidized novolak resin, and urea resin. Furthermore, compounds disclosed in "Kakyozai Handbook (Cross-linking Agent Handbook)", by Shinzo Yamashita and Tosuke Kaneko, published by Taiseisha, Co., Ltd., are also preferable. In particular, phenol derivatives having, in a molecule, at least two groups such as a hydroxymethyl group and alkoxymethyl group provide good toughness in an image portion when an image is formed, and thus are preferable. Examples of phenol derivatives include resol resin.

However, these cross-linking agents are unstable with respect to heat, and thus they are not very favorable in terms of storability after the production of an image recording material.

On the other hand, a phenol derivative having 4 to 8 benzene nuclei, at least one phenolic hydroxyl group, and at least two groups represented by the formula (IV) in a molecule is good in terms of storage stability, and thus it used most preferably in the present invention:

—$CH_2OR^6$

In the formula (IV), $R^6$ represents a hydrogen atom, an alkyl group or an acyl group. Preferable examples of alkyl groups include alkyl groups having 1 to 4 carbon atoms such as methyl group, ethyl group, n-propyl group, isopropyl group, n-butyl group, isobutyl group, sec-butyl group, and t-butyl group. Preferable examples of acyl groups include formyl group, acetyl group, butylyl group, benzoyl group, cinnamoyl group, and valeryl group. Further, a substituted alkyl group having 1 to 4 carbon atoms such as methoxyethyl group, methoxy propyl group, hydroxy ethyl group, and hydroxy propyl group can be used.

Phenol derivatives used in the present invention having H for $R^6$ can be obtained by the reaction of known phenol compounds such as those disclosed in Japanese Patent Application Laid-Open (JP-A) Nos. 1-289946, 3-179353, 3-200252, 3-128959, 3-200254, 5-158233, and 5-224409, and formaldehyde in a strong alkaline medium at about 0 to 80° C., preferably 10 to 60° C. for 1 to 30 hours. By having a further reaction with alcohol, substituted alcohol, acid halide or acid anhydride having 1 to 4 carbon atoms under an acidic condition at 0 to 80° C. for 1 to 30 hours, phenol derivatives having alkyl or acyl for $R^6$ can be obtained. The temperature in the reaction with alcohol or substituted alcohol is preferably 20 to 80° C., and the temperature in the reaction with acid halide or acid anhydride is preferably 0 to 30° C.

Concrete examples of phenol derivatives usable in the present invention include compounds represented by the following general formulae (V) to (XII), however, they are not limited thereto. The phenol derivatives can be used alone or in combination of two or more. In that case, the amount used is 0.2 to 60% by weight, preferably 0.5 to 20% by weight in the image recording layer of the negative type image recording material. Further, since a compound having 1 to 3 benzene nuclei, a phenolic hydroxyl group and a group represented by the formula (IV) deteriorates the inking property and the developing allowability, it is preferable that such compounds are substantially not included in the negative type image recording material of the present invention. More concretely, the content is preferably 5% by weight or less, more preferably 3% by weight or less, and most preferably 0% by weight in the negative type image recording material.

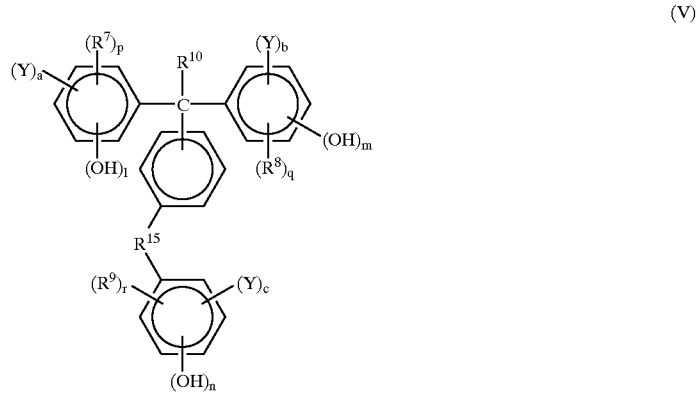

(V)

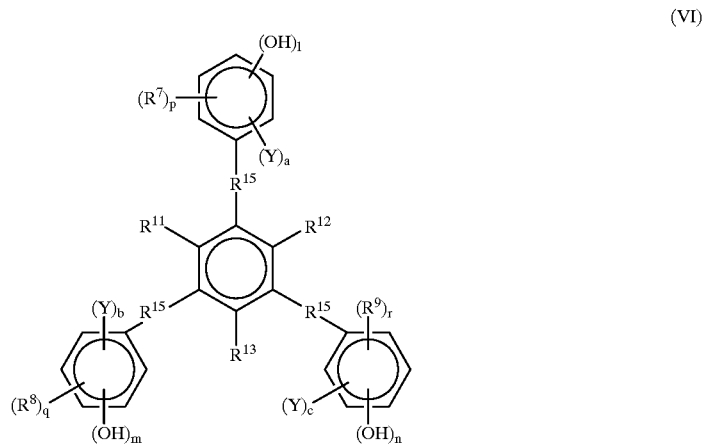

(VI)

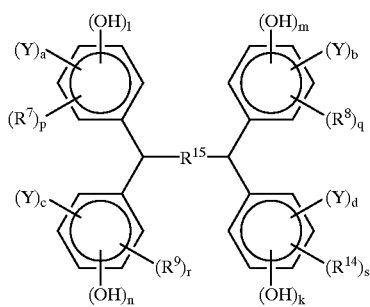
(VII)
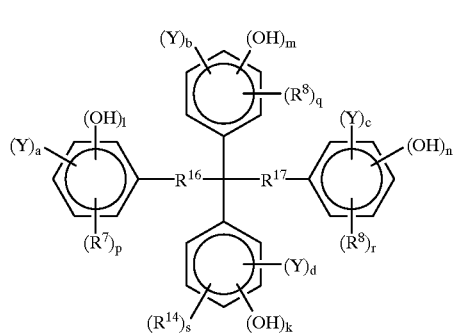
(VIII)
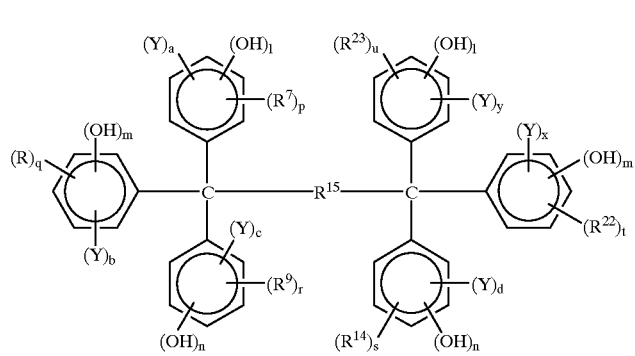
(IX)
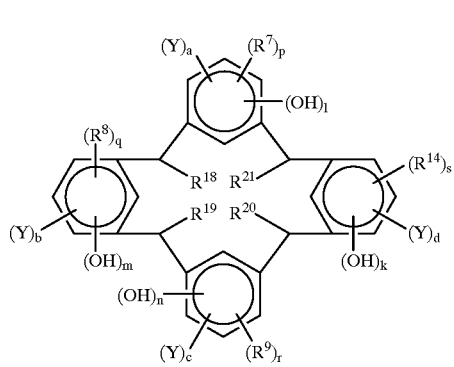
(X)

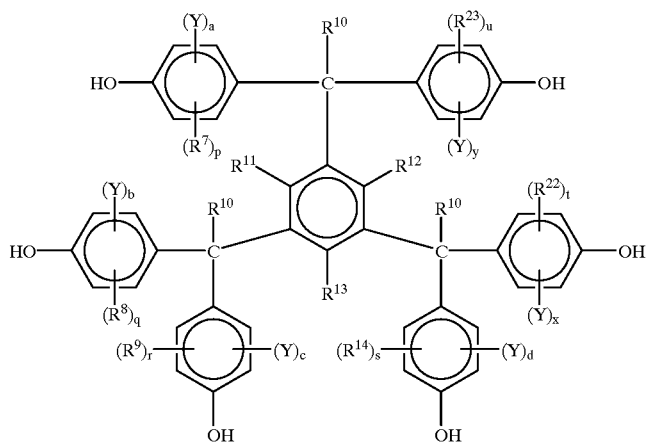

(XI)

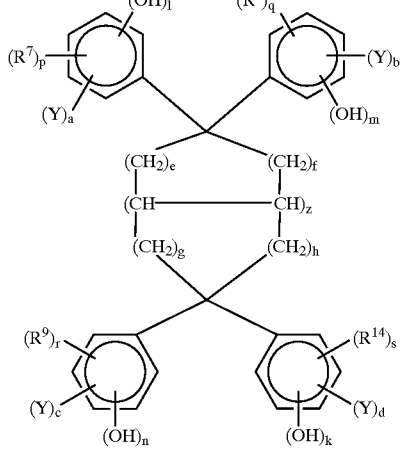

(XII)

In the formulae, $R^7$ to $R^9$, $R^{14}$, $R^{22}$, $R^{23}$ represent a hydrogen atom, a halogen atom, an alkyl group or an alkoxy group. $R^{10}$, $R^{18}$ to $R^{21}$ represent a hydrogen atom or an alkyl group. $R^{11}$ to $R^{13}$ represent a hydrogen atom, a halogen atom or an alkyl group. $R^{15}$ to $R^{17}$ represent a single bond, an alkylene group, alkenylene group, phenylene group, naphthylene group, carbonyl group, ether group, thioether group, which may have a substituent, an amide bond, or a combination of two or more. Y represents a group represented by the general formula (IV), in which a, b, c, d, x, y represent an integer from 0 to 3; a+b+c+d+x+y is an integer from 2 to 16; k, l, m, n represent an integer from 0 to 3, however, all the numerals cannot be 0 at the same time; e, f, g, h, p, q, r, s, t, u, represent an integer from 0 to 3; and z represents 0 or 1. Concrete examples of compounds represented by the above-mentioned general formulae (V) to (XII) include those having the following structures.

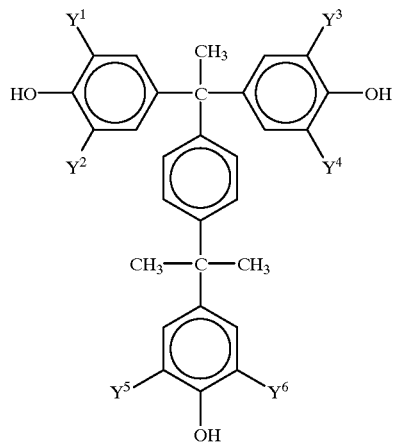
(XIII)
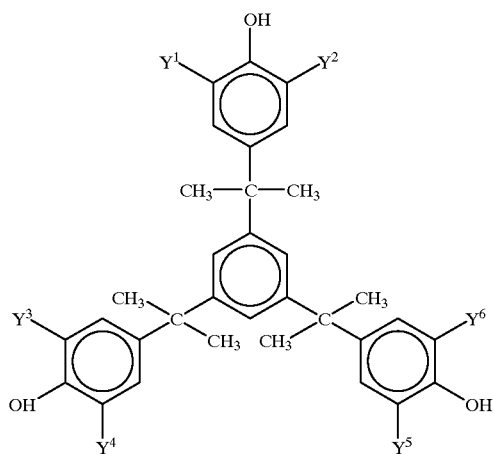
(XIV)
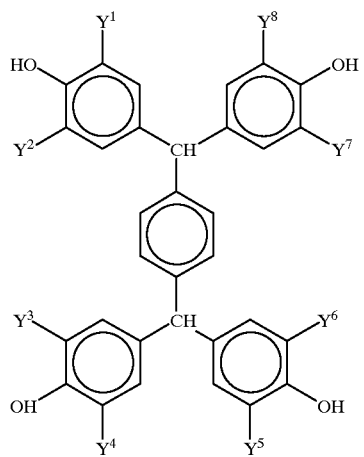
(XV)

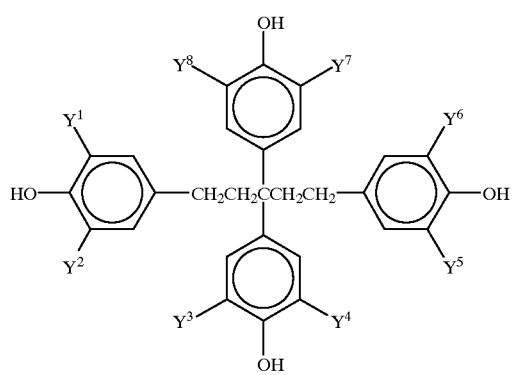
(XVI)
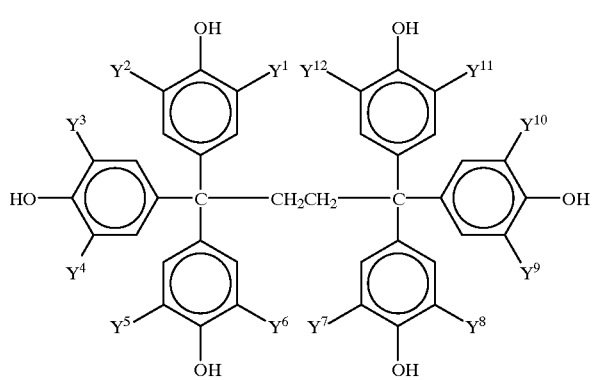
(XVII)
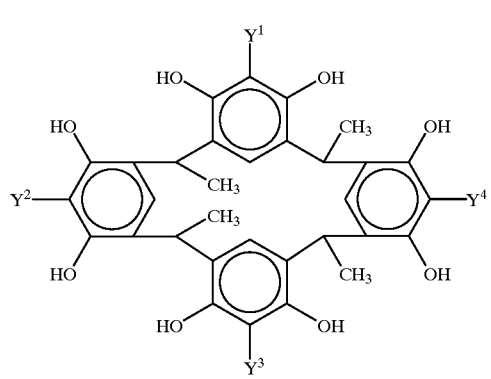
(XVIII)
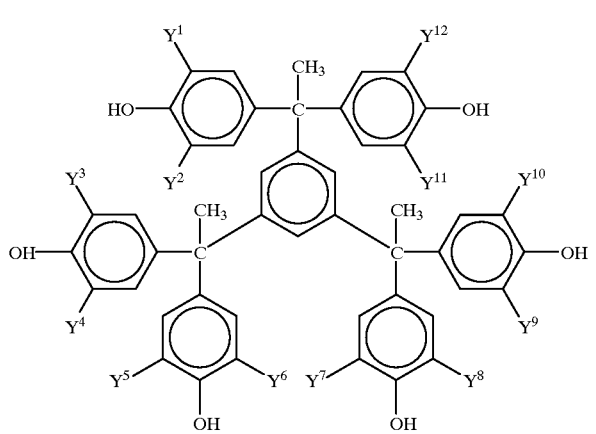
(XIX)

-continued

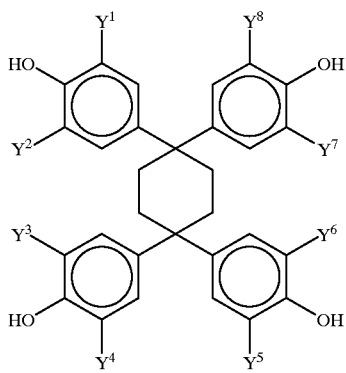

(XX)

In the formulae, $Y^1$ to $Y^{12}$ represent a hydrogen atom or a group represented by the formula (IV). In each compound, at least two groups represented by the formula (IV) are included, and preferably all groups are represented by the formula (IV).

Examples of other heat crosslinking agents preferably used in the present invention include aldehydes or ketones compounds. A compound having two or more aldehyde or ketone in a molecule is preferable.

The heat crosslinking agents can be used alone or in combination of two or more.

In the present invention, the content of the heat crosslinking agent is 5 to 70% by weight, preferably 10 to 65% by weight with respect to the solid component in the total image recording layers of the image recording material. A content of less than 5% by weight deteriorates the layer strength of the image portion after recording an image. On the other hand, a content over 70% by weight causes poor storage stability, and thus neither is preferable.

(C) Acid generating agent

An acid generating agent in the present invention denotes a compound which decomposes and generates acid when exposed to light or heat of 100° C. or more. It is preferable that the acid generated is a strong acid having a pKa of 2 or less such as sulfonic acid and hydrochloric acid. Examples of acid generating agents preferably used in the present invention include onium salts such as an iodonium salt, a sulfonium salt, a phosphonium salt, and a diazonium salt. Specifically, compounds disclosed in U.S. Pat. Nos. 4,708, 925 and 5,372,907 can be used. In particular, iodonium salts, sulfonium salts, and diazonium salts, having sulfonic acid ions as the counter ions are preferable.

Preferable examples of diazonium compounds include diazonium compounds disclosed in U.S. Pat. No. 3,867,147, diazonium compounds disclosed in U.S. Pat. No. 2,632, 703, and diazo resins disclosed in the Japanese Patent Application cut-Laid-Open (JP-A) Nos. 1-102456 and 1-102457.

Benzyl sulfonates disclosed in U.S. Pat. Nos. 5,135,838 and 5,200,544 are also preferable. Active sulfonic acid esters and disulfonyl compounds disclosed in Japanese Patent Application Laid-Open (JP-A) Nos. 2-100054 and 2-100055 and Japanese Patent Application Laid-Open (JP-A) No. 9-197671 are also preferable. Furthermore, haloalkyl substituted S-triazines disclosed in Japanese Patent Application Laid-Open (JP-A) No. 7-271029 are also preferable.

These compounds can be used alone or in combination of two or more.

In the present invention, these compounds are added to the image recording layer of the image recording material in amounts of 0.01 to 50% by weight with respect to the total solid component of the image recording layer, with 0.1 to 25% by weight being preferable and 0.5 to 15% by weight more preferable. If the amount is less than 0.01%, an image cannot be obtained. On the other hand, an amount over 50% by weight results in the generation of dirt in the non-image portion at the time of printing.

Spectral sensitizing agent

In the present invention, the above-mentioned acid generating agents decompose and generate acid when exposed to light or heat. When using acid generating agents which decompose when exposed to light, it is not necessary to use a spectral sensitizing agent when irradiating light absorbed by the acid generating agent (such as ultraviolet light). However, when light not absorbed or slightly absorbed by the acid generating agent is irradiated, a spectral sensitizing agent is necessary. Sensitizing agents like known an sensitizing agents conventionally used in light radical polymerization type image recording materials can be used when visible light is irradiated. Specific examples include the eosins disclosed in Japanese Patent Application Laid-Open (JP-A) No. 4-219756 and the dyes having a thiazolidinone skeleton disclosed in Japanese Patent Application Laid-Open (JP-A) Nos. 2-244050 and 8-220757. However, image recording materials of the present invention do not contain a radically polymerizable polyfunctional monomer. Therefore, the reason why a sensitizing agent effectively used in the above-mentioned photo radical polymerization type can be also effectively used in the present invention is not clearly known.

One of the main purposes of the present invention is to record an image with an infrared ray generating laser. In order to carry out image recording effectively, both the above-described spectral sensitizing agent and an infrared ray absorbing agent need to be used as spectral sensitizing agents.

Infrared ray absorbing agents used in the present invention are a dye or pigment effectively absorbing an infrared ray having a wavelength of 760 nm to 1,200 nm. It is preferable that the dye or pigment have an absorption maximum between the wavelengths of 760 nm and 1,200 nm.

As dyes, known dyes commercially available or those disclosed in the literature (such as "Senryo Binran (Dye Handbook)" edited by Yuki Gosei Kagaku Kyokai (Organic Synthetic Chemistry Association), published in 1970, can be used. Specifically, examples include azo dyes, metal complex azo dyes, pyrazolone azo dyes, naphthoquinone dyes, anthraquinone dyes, phthalocyanine dyes, carbonium dyes, quinoneimine dyes, methyne dyes, cyanine dyes, squalilium dyes, pyrylium salts and metal thiolate complexes.

Examples of preferable dyes include cyanine dyes disclosed in Japanese Patent Application Laid-open (JP-A) Nos. 58-125246, 59-84356, 59-202829, and 60-78787; methyne dyes disclosed in Japanese Patent Application Laid-open (JP-A) Nos. 58-173696, 58-181690, and 58-194595; naphthoquinone dyes disclosed in Japanese Patent Application Laid-open (JP-A) Nos. 58-112793, 58-224793, 59-48187, 59-73996, 60-52940, and 60-63744; squalilium dyes disclosed in Japanese Patent Application Laid-Open (JP-A) No. 58-112792; and cyanine dyes disclosed in U. K. Patent No. 434,875.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethyne thiapyrylium salts disclosed in Japanese Patent Application Laid-Open (JP-A) No. 57-142645 (U.S. Pat. No. 4,327,169) ; pyrylium-containing compounds disclosed in Japanese Patent Application Laid-Open (JP-A) Nos. 58-181051, 58-220143, 59-41363, 59-84248, 59-84249, 59-146063, and 146061; cyanine dyes disclosed in Japanese Patent Application Laid-Open (JP-A) No. 59-216146; pentamethyne thiopyrylium salts disclosed in U.S. Pat. No. 4,283,475; and pyrylium compounds disclosed in Japanese Patent Application Publication Nos. 5-13514 and 5-19702 can be preferably used as well.

As other examples of preferable dyes, near infrared absorption dyes disclosed U.S. Pat. No. 4,756,993 represented by formulas (I) and (II) can be presented. Among these dyes, particularly preferable are cyanine dyes, squalilium dyes, pyrylium salts, and nickel thiolate complexes.

Pigments usable in the present invention include commercially available pigments and those disclosed in the Color Index (C. I.) Manual, "Saishin Ganryo Binran (Modern Pigment Manual)" edited by Nippon Ganryo Gijutsu Kyokai (Japan Pigment Technology Association), published in 1977; "Saishin Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after being applied with surface treatment. Examples of surface treatment methods include a method of surface coating with a resin or a wax, a method of adhering a surfactant, and a method of bonding a reactive substance (such as a silane coupling agent, an epoxy compound, and polyisocyanate) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press; published in 1984; and "Saishin Ganryo Oyo Gijutsu (Modern Pigment Application Technology)" by CMC Press, published in 1986.

A pigment particle size of 0.01 $\mu$m to 10 $\mu$m is preferable, 0.05 $\mu$m to 1 $\mu$m is more preferable, and 0.1 $\mu$m to 1 $\mu$m is the most preferable. A pigment particle size smaller than 0.01 $\mu$m is not preferable in terms of the stability of the pigment dispersion in a photosensitive layer coating solution. On the other hand, a pigment particle size larger than 10 $\mu$m is not preferable in terms of the uniformity of the image recording in layer.

As methods of dispersing a pigment, known dispersing methods employed in ink production or toner production can be used. Examples of dispersing machines include ultrasonic dispersing machines, sand mills, attritors, pearlmills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

These dyes or pigments can be added in an amount of 0.01 to 50% by weight based on the total solid component in the image recording layer of the image recording material, preferably in an amount of 0.1 to 10% by weight, more preferably in an amount of 0.5 to 10% by weight in the case of a dye, and more preferably in an amount of 1.0 to 10% by weight in the case of a pigment. An amount of a pigment or dye less than 0.01% by weight causes low sensitivity. On the other hand, an amount more than 50% by weight produces stains in a nonimage portion at the time of printing.

These dyes or pigments can be added in a layer with other components or, in a case in which the image recording material comprises a plurality of layers, can be added in a layer which is different from a layer containing the other components.

In general, in the case of a visible light sensitizing agent, the functional mechanism is considered to be due to energy transfer or electron transfer as disclosed in "Zokanzai (sensitizing agents)" by Katsumi Tokumaru and Shin Ogawara, published by Kodansha Co., Ltd. However, the functional mechanism of infrared ray sensitizing agents has not yet been fully elucidated. However, it has been suggested that infrared ray absorbing agents generate heat and thermally decompose acid generating agents upon absorption of infrared light.

other Components

In the present invention, the above-mentioned four components (A) to (D) are necessary, and various compounds can be added to the image recording material as needed.

For example, a dye having a large absorption in the visible light region can be used as the coloring agent.

Specifically, examples include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (CI42555), Methyl Violet (CI42535), Ethyl Violet, Rhodamine B (CII45170B), Malachite Green (CI42000), Methylene Blue (CI52015), and dyes disclosed in Japanese Patent Application Laid-Open (JP-A) No. 62-293247.

It is preferable to add these dyes for easily distinguishing the image portion and the nonimage portion after image formation. The amount to be added is 0.01 to 10% by weight based on the total solid component of the image recording material.

In order to enable stable treatment regardless of the fluctuation in development conditions, a nonionic surfactant disclosed in Japanese Patent Application Laid-open (JP-A) Nos. 62-251740 and 3-208514 and an ampholytic surfactant disclosed in Japanese Patent Application Laid-Open (JP-A) Nos. 59-121044 and 4-13149 can be added to an image recording material of the present invention.

Examples of nonionic surfactants include sorbitan tristearate, sorbitan monopalmitate, sorbitan triolate, mono glyceride stearate, and polyoxyethylene nonylphenyl ether.

Examples of ampholytic surfactants include alkyl di(aminoethyl)glycine, alkyl polyaminoethylglycine hydrochloride, 2-alkyl-n-carboxyethyl-N-hydroxyethyl imidazolinium betaine, and N-tetradecyl-N,N-substituted betaine (for example, Amorgen K manufactured by Dai-Ichi Kogyo Co., Ltd.).

The amount of the above-mentioned nonionic surfactants and ampholytic surfactants is preferably 0.05to 15% by weight, and more preferably 0.1 to 5% by weight in the image recording layer of the image recording material.

In order to provide flexibility to the coated layer etc., a plasticizer can be added as needed to the image recording material of the present invention. Examples of a plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In addition to a polyurethane resin having a carboxyl group, a known polymer, such as a novolak resin or an acrylate it resin can be added to the image recording material of the present invention. A preferable amount is 40% by weight or less in the image recording layer of the image recording material.

An image recording material of the present invention can be produced, in general, by dissolving the above-mentioned component in a solvent and applying the resultant solution to an appropriate support. Solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrolidone, dimethyl sulfoxide, sulfolane, y-butyl lactone, toluene, and water.

These solvents are used alone or as a mixture. The concentration of the above-mentioned components (total solid components including additives) is preferably 1 to 50% by weight in the solution. The application amount (solid component) on the support obtained after applying and drying is determined according to the application purpose. However, as to the planographic printing plate, in general, 0.5 to 5.0 g/$M^2$ is preferable. As a method of application, various methods can be used, such as bar coater application, rotation application, spray application, curtain application, dip application, air knife application, blade application, and roll application. As the application amount decreases, the apparent sensitivity increases, but the layer characteristic of the image recording layer decreases.

A surfactant for improving the applicability, such as a fluorine-containing surfactant disclosed in Japanese Patent Application Laid-Open (JP-A) No. 62-170950 can be added to an image recording layer of the present invention. An addition amount is preferably 0.01 to 1% by weight based on the total solid component in the coated layers of the image recording material, and more preferably 0.05 to 0.5% by weight.

Support

Examples of a support used in the present invention include dimensionally stable plate-like substances such as paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-mentioned metals.

A polyester film or an aluminum plate is preferable as a support in the present invention. In particular, an aluminum plate is preferable since it has good dimensional stability and can be provided at a relatively low cost. Examples of preferable aluminum plates include pure aluminum plates and alloy plates comprising aluminum as the main component and trace quantities of a different element. Furthermore, plastic films to which aluminum is laminated or deposited can also be used. Examples of different elements included in an aluminum alloy include silicon, iron, manganese, copper, magnesium, chrome, zinc, bismuth, nickel, and titanium. A total amount of the different elements in the alloy is preferably 10% by weight or less. In the present invention, pure aluminum is particularly preferable. However, since production of a completely pure aluminum is difficult in terms of refining technology, one containing trace quantities of a different element can be used. The composition of an aluminum plate applied in the present invention as mentioned above is not specifically defined, and a known aluminum plate can be also used. The thickness of an aluminum plate used in the present invention is about 0.1 mm to 0.6 mm, preferably 0.15 mm to 0.4 mm, and more preferably 0.2 mm to 0.3 mm In cases where an aluminum plate is used as a support, it is preferable to roughen the aluminum plate surface, in order to improve the adherence with a recording layer formed on the support.

Prior to the roughening of the aluminum plate, a degreasing treatment with a surfactant, an organic solvent, or an aqueous alkaline solution is conducted for removing the rolling oil on the surface as needed.

The surface roughening treatment of an aluminum plate can be implemented using various methods, such as a mechanically roughening method, an electrochemically roughening method in which a plate surface is dissolved, and a chemically roughening method in which a plate surface is dissolved selectively. As a mechanical method, known methods such as a ball abrasion method, brush abrasion method, blast abrasion method, and buff abrasion method can be used. As an electrochemically roughening method, a method in which an alternating current or direct current is applied to a plate in an electrolytic solution containing a hydrochloric acid or nitric acid can be used. Further, a method combining both of the above-mentioned methods as disclosed in Japanese Patent Application Laid-Open (JP-A) No. 54-63902 can be used.

An aluminum plate to which surface roughening treatment is applied may be subjected to an alkaline etching treatment or a neutralizing treatment, if necessary, followed by an anodizing treatment so as to improve the water retention property and the abrasion resistance property of the surface, if desired. As an electrolyte used in the anodizing treatment of an aluminum plate, various electrolytes which form a porous oxide film can be used. In general, sulfuric acid, phosphoric acid, oxalic acid, chromic acid, or a mixture thereof can be used. The concentration of an electrolyte is suitably decided according to the type of electrolyte.

Conditions of anodizing are determined according to the type of electrolyte to be used, and thus cannot be specified as a whole. However, in general, conditions of an electrolyte solution concentration of 1 to 80% by weight, a solution temperature of 5 to 70° C., a current density of 5 to 60 A/dm$^2$, a voltage of 1 to 100 V, and an electrolysis duration of 10 seconds to 5 minutes are appropriate.

An amount of anodized film less than 1.0 g /m$^2$ causes insufficient plate wear, and scratches are easily produced in a nonimage portion of the planographic printing plate and, thereby, so-called "tinting" which occurs by inking the scratches is easily produced.

After the anodizing treatment, hydrophilic treatment is applied to the aluminum surface, if necessary. Examples of a hydrophilic treatment used in the present invention include an alkaline metal silicate (such as an aqueous solution of sodium silicate) method as disclosed in U.S. Pat. Nos. 2,714,066, 3,181,461, 3,280,734, and 3,902,734. In this method, the support is treated by immersing or electrolysis with an aqueous solution of sodium silicate. Other examples include a method of treating with potassium fluorozirconate disclosed in Japanese Patent Application Publication (JP-B) No. 36-22063 and a method of treating with polyvinyl phosphonate disclosed in U.S. Pat. Nos. 3,276,868, No. 4,153,461, and 4,689,272.

Others

An image recording material of the present invention can comprise a primer layer on the support, if necessary.

Various organic compounds can be used as a primer layer component. Examples include carboxy methyl cellulose; dextrin; gum arabic; organic phosphonic acids which may be substituted, such as phosphoric acids having an amino group (for example, 2-amino ethyl phosphonic acid), phenyl phosphonic acid, naphthyl phosphonic acid, alkyl phosphonic acid, glycero phosphonic acid, methylene diphosphonic acid, and ethylene diphosphonic acid; organic phorphoric acids which may be substituted, such as phenyl phosphoric acid, naphthyl phosphoric acid, alkyl phosphoric acid, and glycero phosphoric acid; organic phosphinic acids which may be substituted, such as phenyl phosphinic acid, naphthyl phosphinic acid, alkyl phosphinic acid, and glycero phosphinic acid; amino acids such as glycine and P-alanine; and hydrochlorides of amine having a hydroxy group, such as hydrochloride of triethanol amine. A primer layer component can be selected therefrom, and can be used in a combination of two or more.

Further, it is also preferable to apply the above-mentioned diazonium compound as an undercoat.

An appropriate amount of an organic primer layer is 2 to 200 Mg/M$^2$.

The planographic printing plate using the image recording material of the present invention can be produced as described above. The planographic printing plate can be used for recording with rays emitted from various types of light sources. For example, ultraviolet rays, visual light beams, or infrared rays can be used for recording. These light sources can be a lamp or a laser. Further, thermal recording with a thermal head is also possible.

In the present invention, the planographic printing plate is preferably exposed imagewise to an ultraviolet ray emitted from an ultraviolet lamp or to an infrared ray having a wavelength of 760 nm to 1,200 nm emitted from a solid-state laser or a semiconductor laser. In the present invention, the printing plate can be developed immediately after exposure but may be treated with heat between the exposure process and the developing process. Preferable temperature and time of a heat treatment are a range of 60° C. to 150° C. and a duration of 5 seconds to 5 minutes, respectively. As a heating method, various conventionally known methods, such as a method of heating with a panel heater or a ceramic heater, and a method of heating with a lamp can be used. Specifically, the methods disclosed in Japanese Patent Application No. 8-94197 can be used. The laser energy necessary for recording due to laser irradiation can be reduced by the heat treatment.

If heat treatment is image wisely carried out during the production of the planographic printing plate used in the present invention, this heat causes the acid generating agent to generate an acid. The acid then causes a crosslinking reaction initiated by the crosslinking agent with the heat further facilitating the crosslinking reaction. On the other hand, in cases where the plate is image wisely irradiated with light, the light causes the acid generating agent to generate an acid which then causes a cross linking reaction initiated by the crosslinking agent. If heat is applied at this point, the crosslinking reaction is accelerated even with only a mild heat when compared to the former case where heat treatment only was applied. Accordingly, in the printing plate making process, it is preferable to apply either a combination of light irradiation and heat treatment or else heat treatment only.

After the heat treatment, as occasion demands, the image recording material of the present invention is preferably developed by water or an aqueous alkaline solution.

When an aqueous alkaline solution is used for development, a conventionally known aqueous alkaline solution can be used as a developer or a replenisher for an image recording material of the present invention. Examples include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Furthermore, also used are organic alkaline agents such as moonomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monolsopropanol amine, diisopropanol amine, ethylene imine, ethylene diamine, and pyridine.

These alkaline agents can be used alone or in a combination of two or more.

Particularly preferable developers among these alkaline agents are an aqueous solution of silicate, such as sodium silicate, and potassium silicate. These are preferable because the developing property can be adjusted by the ratio and concentration of silicon dioxide $Sio_2$ which is a component of silicate and an alkaline metal oxide $M_2O$. For example, alkaline metal silicates disclosed in Japanese Patent Application Laid-Open (JP-A) No. 54-62004 and Japanese Patent Application Publication (JP-B) No. 57-7427 can be used effectively.

Furthermore, it is know that, in a case in which an automatic developing machine is used for developing, by adding to the developer an aqueous solution (replenisher) whose alkaline is stronger than that of the developer, a large amount of planographic printing plates can be developed without changing the developer in the developing tank for a long time. The replenishing method is also preferably applied in the present invention.

Various types of surfactants and organic solvents can be added to a developer or a replenisher for promoting or curbing the developing property, improving the dispersion of developing scum or conformity of the printing plate image portion to ink as needed. Examples of preferable surfactants include anionic surfactants, cationic surfactants, nonionic surfactants, and ampholitic surfactants. Examples of preferable organic solvents include benzyl alcohol. It is also preferable to add polyethylene glycol or a derivative thereof, or polypropylene glycol or a derivative thereof.

Furthermore, reducing agents such as a sodium salt or a potassium salt of hydroquinone, resorcin, an inorganic acid including sulfurous acid and hydrogen sulfurous acid, organic carboxylic acid, antifoaming agents, and water softeners can be added to a developer or a replenisher as needed.

Examples of developers containing a surfactant, an organic solvent and a reducing agent include a developer composition comprising benzyl alcohol, an anionic surfactant, an alkaline agent and water, as disclosed in Japanese Patent Application Laid-Open (JP-A) No. 51-77401, a developer composition comprising benzyl alcohol, an anionic surfactant, and an aqueous solution including a water soluble sulfite, as disclosed in Japanese Patent Application Laid-Open (JP-A) No. 53-44202, and a developer composition comprising an organic solvent having a solubility in water at room temperature of 10% by weight or less, an alkaline agent and water, as disclosed in Japanese Patent Application Laid-Open (JP-A) No. 55-155355. These developers are preferably used in the present invention.

Printing plates developed with the above-mentioned developers and replenishers are subjected to a post treatment with a rinsing solution containing water, a surfactant, etc., and a desensitizing solution containing gum arabic, a starch derivative, etc. As a post treatment employed in a case in which an image recording material of the present invention is used as the printing plate, these treatments can be used in combination.

Recently, an automatic developing machine has been widely used in plate making and printing industries in order to streamline and standardize the plate making operation. In general, this automatic developing machine comprises a developing part and a post treatment part, and each part comprises a device for conveying a printing plate, treatment tanks, and spraying devices, wherein the developing processing is carried out by spraying a treatment, which is pumped up by a pump, from a spray nozzle to the printing plate after exposure, while the printing plate is being conveyed horizontally. In addition, a processing method has also become known recently in which an exposed printing plate is immersed in a treatment tank filled with the treatment while the printing plate is being conveyed by guide rolls. In such automatic processing, a replenisher can be replenished for each treatment depending upon the amount of printing plate to be developed, work time, and the like.

The so-called disposable method, wherein a substantially unused treating solution is utilized for treatment, can be applied as well.

A planographic printing plate obtained as mentioned above can be provided for a printing process, after applying a desensitizing gum, if desired. However, in a case in which a planographic printing plate having higher plate wear is desired, a burning treatment is applied to it.

In a case in which a burning treatment is applied to a planographic printing plate, it is preferable to treat the plate with a counter etching solution, as disclosed in Japanese Patent Application Publication (JP-B) Nos. 61-2518 and 55-28062, and Japanese Patent Application Laid-Open (JP-A) Nos. 62-31859, and 61-159655, before burning.

Methods thereof include a method of applying the counter etching solution on a planographic printing plate with a sponge or an absorbent cotton impregnated with them, a method of applying the counter etching solution to a printing plate by immersion the plate in a tray filled with the solution, and a method of applying the solution to the plate by an automatic coater. By equalizing an amount of the solution with a squeegee or a squeegee roller after the application, a further preferable result can be obtained.

An appropriate amount of a counter etching solution to be applied is of 0.03 to 0.8 g/m$^2$ (dry weight), in general.

A planographic printing plate to which the counter etching solution is applied and which is dried is heated at a high temperature with a burning processor (such as a burning processor BP-1300 commercially available from Fuji Photo Film Co., Ltd.) as needed. The heating temperature and the duration depend on the type of components forming the image. However, a range of 180 to 300° C. and a range of 1 to 20 minutes are preferable.

A planographic printing plate treated with the burning treatment can be subjected to conventional treatments such as washing with water and gum coating as needed. However, in a case in which a counter etching solution containing a water-soluble polymer compound is used, a desensitizing treatment such as gum coating can be omitted.

A planographic printing plate obtained by such treatment is used in an offset printer for printing large quantities.

EXAMPLES

The present invention shall now be explained in detail by way of examples. However the present invention is not limited by these examples.

Synthesis of the Polyurethane Resin [BP-1]

125 g of 4, 4'-diphenyl methane diisocyanate and 67 g of 2,2-bis(hydroxymethyl) propionic acid were dissolved in 290 ml of dioxane in a 500 ml-three neck flask. After adding 1 g of N,N-diethylaniline, the mixture was stirred for 6 hours under dioxane reflux. When the reaction was finished, polymers were precipitated by gradually adding the mixture to a solution containing 4 liters of water and 40 ml of acetic acid. The solid matter was vacuum-dried to obtain 185 g of a polyurethane resin [BP-1]. The acid content was 2,47 meq/g. The weight average molecular weight measured by GPC was 28,000 (polystyrene reference).

Synthesis of the Polymer rBP-2]

Polyurethane resin [BP-2] was synthesized by a process the same as that described above except that the 125 g of 4,4'-diphenylmethane diisocyanate was replaced with 70 mol % of 4,4'-diphenylmethane diisocyanate and 30 mol % of hexamethylene diisocyanate, and the 67 g of 2,2-bis (hydroxymethyl) propionic acid was replaced with 60 mol % of 2,2-bis (hydroxymethyl) propionic acid and 40 mol % of diethylene glycol. The acid content was 1.64 meq/g. The weight average measured by GPC was 32,000 (polystyrene reference).

Synthesis of the Crosslinking Agent [rkz-1]

20 g of 1-[α-methyl-α-(4-hydroxyphenyl) ethyl]-4-α, α-bis (4-hydroxyphenyl) ethyl] benzene was dissolved in 100 ml of a 10% aqueous solution of potassium hydroxide. 60 ml of 37% formalin was gradually added by drops to the reaction solution at room temperature over 1 hour while stirring. The reaction solution was stirred at room temperature for further 6 hours and added to an aqueous solution of sulfuric acid for crystallization. The obtained paste-like precipitate was washed with water thoroughly. Then by recrystallizing with 30 ml of methanol, a white powdery crosslinking agent [KZ-1] was obtained. The amount was 20 g. The obtained compound was found from the NMR to be a hexamethylol compound of 1-[α-methyl-α-(4-hydroxyphenyl) ethyl]-4-[αα-bis(4-hydroxyphenyl) ethyl] benzene. The purity of the hexamethylol compound by the reverse phase HPLC (column: Shimpac CLC-ODS (produced by Shimadzu Seisakusho Co., Ltd.), solvent: methanol/water=60/40→90/10) was 92%. Crosslinking agent [KZ-1]

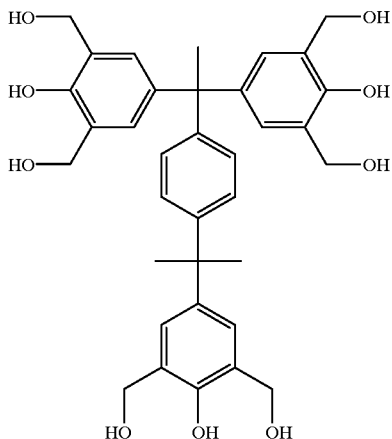

Synthesis of crosslinking agent fKZ-21

By the condensing reaction of bisphenol A and formalin in a basic condition, a resol resin having a weight average molecular weight of 2000 was synthesized as the crosslinking agent [KZ-2].

Example

An aluminum plate (material 1050) having a thickness of 0.30 mm was degreased by washing with trichloroethylene. The aluminum plate was applied with a roughing treatment by graining the surface with a nylon blush and a 400 mesh pamiston-water suspension, then washed thoroughly with water. The plate was etched by being soaked in a 25% aqueous solution of sodium hydroxide at 45° C. for 9 seconds and washed with water. The plate was further soaked in a 2% $HNO_3$ for 20 seconds and washed with water. The etching amount of the grained surface was about 3 g/m². Then the plate was provided with a direct current anodic oxidized layer of 3 g/² with a 7% $H_2SO_4$ as the electrolyte and the current density at 15 A/dm². The plate was soaked in a 2.5% aqueous solution of sodium silicate at 70° C. for 1 minute, washed with water and dried.

The following solution [P-1] was prepared, applied onto the above-mentioned aluminum plate and dried at 100° C. for 1 minute so as to obtain a negative type planographic printing plate [P-1]. The weight of the layer after drying was 1.5 g/M². Solution [P-1]

| | |
|---|---|
| Polyurethane resin [BP-1] | 1.6 g |
| Crosslinking agent [KZ-1] | 0.4 g |
| Hexafluorophosphate of 2-methoxy-4-pheny aminobenzene diazonium | 0.10 g |
| Infrared ray absorbing agent [SK-1] (below-mentioned structure) | 0.10 g |
| "Megafak F-177" (produced by Dainihon Ink Chemical Industry, Co., Ltd. A fluorine-containing surface active agent) | 0.06 g |
| Methylethyl ketone | 15 g |
| 1-methoxy-2-propanol | 5 g |
| Methyl alcohol | 7 g |

Infrared ray absorbing agent [SK-1]

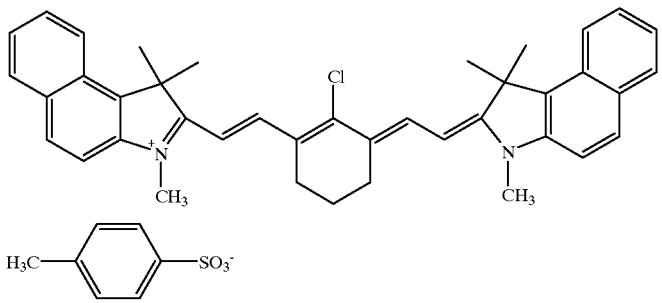

The negative type planographic printing plate thus obtained [P-1] was exposed with an infrared ray of a wavelength of about 830 to 850 nm emitted from a semiconductor laser. After the exposure, heat treatment was applied to the planographic printing plate with a panel heater at 110° C. for 15 seconds. The printing plate was then processed with a developer "DN-3C" (1: 1) produced by Fuji Photo Film Co., Ltd. to obtain a sharp negative image. Using the printing plate, printing was conducted with Heidel KOR-D machine to obtain 50,000 sheets of clean prints.

Comparative Example 1

A negative type planographic printing plate [Q-1] was obtained by using the same process as that in Example 1, except that the crosslinking agent [KZ - 1 was not used in the solution [P-1]. The printing plate thus obtained (Q-1] was exposed by a laser, heated, and developed as in Example 1 but an image was not obtained.

Example 2

The following solution [P-2] was prepared and applied onto the aluminum plate produced in Example 1. The aluminum plate was dried at 100° C. for 1 minute to obtain a negative type planographic printing plate [P-2]. The weight of the coated layer after drying was 1.5 g/m². Solution [P-2]

| Polyurethane resin [BP-2] | 1.6 g |
| --- | --- |
| Crosslinking agent [KZ-1] | 0.4 g |
| Hexafluorophosphate of a condensation product of 2-methoxy-4-phenyl amino benzene diazonium and formaldehyde | 0.10 g |
| Infrared ray absorbing agent [SK-1] | 0.10 g |
| "Megafak F-177" (produced by Dainihon Ink Chemical Industry, Co., Ltd., a fluorine-containing surface active agent) | 0.06 g |
| Methyl ethylketone | 15 g |
| 1-methoxy-2-propanol | 5 g |
| Methyl alcohol | 7 g |

The negative type planographic printing plate [P-2] thus obtained was exposed by a laser, heated, and developed as in Example 1 to obtain a sharp negative image. Using this printing plate, printing was conducted with Heidel KOR-D machine to obtain 55,000 sheets of clean prints.

Comparative Example 2

A negative type planographic printing plate [Q-2] was obtained by using the same process as that in Example 1, except that the crosslinking agent [KZ-1] was not used in the solution [P-2]. The planographic printing plate [Q-2] thus obtained was exposed by a laser, heated, and developed as in Example 2 to obtain an image. With the printing plate, printing was conducted with Heidel KOR-D machine to obtain only 20,000 sheets of clean prints.

Example 3

The following solution [P-3] was prepared and applied onto the aluminum plate produced in Example 1. The aluminum plate was dried at 100° C. for 1 minute to obtain a negative type planographic printing plate [P-3]. The weight of the coated layer after drying was 1.5 g/M². Solution [P-3]

| Polyurethane resin [BP-2] | 1.6 g |
| --- | --- |
| Crosslinking agent [KZ-2] | 0.4 g |
| Dibutyl naphthalene sulfonate of a condensation product of 2-methoxy-4-phenyl aminobenzene diazonium and formaldehyde | 0.10 g |
| Infrared ray absorbing agent [SK-1] | 0.10 g |
| "Megafak F-177" (produced by Dainihon Ink Chemical Industry, Co., Ltd., a fluorine-containing surface active agent) | 0.06 g |
| Methylethyl ketone | 15 g |
| 1-methoxy-2-propanol | 5 g |
| Methyl alcohol | 7 g |

The negative type planographic printing plate [P-3] thus obtained was exposed by a laser, heated, and developed as in Example 1 to obtain a sharp negative image. With the printing plate, printing was conducted with Heidel KOR-D machine to obtain 52,000 sheets of clean prints.

Comparative Example 3

A negative type planographic printing plate [Q-3] was obtained by using the same process as that in Example 1, except that the crosslinking agent [KZ-1] was not used in the solution [P-3]. The planographic printing plate [Q-3] thus obtained was exposed by a laser, heated, and developed as in Example 3 to obtain an image. With the printing plate, printing was conducted with Heidel KOR-D machine to obtain only 20,000 sheets of clean prints.

What is claimed is:

1. A negative planographic printing plate for use with an infrared laser, comprising:

a substrate which is an aluminum plate; and a negative image recording material provided on the substrate and comprising a polyurethane resin having a carboxyl group, a compound crosslinkable by an acid, and a compound generating an acid due to application of light or heat, wherein said compound crosslinkable by an acid is a phenol derivative having, in a molecule, 4 to 8 benzene nuclei, at least one phenolic hydroxyl group, and at least two groups represented by the formula (IV);

$$—CH_2OR^6 \quad (IV)$$

wherein $R^6$ represents a hydrogen atom, an alkyl group or an acyl group.

2. The negative planographic printing plate according to claim 1, wherein said polyurethane resin having a carboxyl group has a primary skeleton which is the reaction product obtained by the reaction of a diisocyanate compound represented by following general formula (I), and a diol compound having a carboxyl group represented by following general formula (II) or (III):

$$OCN—R^1NCO \quad (I)$$

$$HO—R^3—\underset{\underset{COOH}{\overset{R^5}{|}}}{\overset{R^2}{\overset{|}{C}}}—R^4—OH \quad (II)$$

$$HO—R_3—\underset{\underset{COOH}{\overset{R^5}{|}}}{Ar}—R^4—OH \quad (III)$$

wherein $R^1$ represents a divalent aliphatic or aromatic hydrocarbon, which may be substituted; $R^2$ represents a hydrogen atom, an alkyl group, an aralkyl group, an aryl group, an alkoxy group, or an aryloxy group, which may be substituted; $R^3$ to $R^5$ each represent a divalent aliphatic or aromatic hydrocarbon, which may have a single bond or may be substituted; and Ar represents a tri-valent aromatic hydrocarbon which may be substituted.

3. The negative planographic printing plate according to claim 1, further comprising a spectral sensitizer.

4. The negative planographic printing plate according to claim 1, wherein said printing plate further comprise an infrared ray absorbing agent.

5. A negative planographic printing plate for use with an infrared laser, comprising:

a substrate which is an aluminum plate; and a negative image recording material, comprising a polyurethane resin having a carboxyl group, a compound crosslinkable by an acid, and a compound generating an acid due to application of light or heat, wherein said polyurethane resin having a carboxyl group has a primary skeleton which is the reaction product obtained by the reaction of 4,4'-diphenylmethane diisocyanate and/or hexamethylene diisocyanate and 2,2-bis(hydroxymethyl)propionic acid and/or diethylene glycol, wherein said compound crosslinkable by an acid is a phenol derivative having, in a molecule, 4 to 8 benzene nuclei, at least one phenolic hydroxyl group, and at least two groups represented by the formula (IV):

$$—CH_2OR^6 \tag{IV}$$

wherein, $R^6$ represents a hydrogen atom, an alkyl group or an acyl group.

6. The negative planographic printing plate according to claim 5, further comprising a spectral sensitizer.

* * * * *

UNITED STATES PATENT AND TRADEMARK OFFICE
CERTIFICATE OF CORRECTION

PATENT NO. : 6,013,412
APPLICATION NO. : 09/030424
DATED : January 11, 2000
INVENTOR(S) : K. Aoshima Page 1 of 1

It is certified that error appears in the above-identified patent and that said Letters Patent is hereby corrected as shown below:

On Title Page

The following information is added:

Item [56]             References Cited

FOREIGN PATENT DOCUMENTS

| | | |
|---|---|---|
| 08334893 | 12/1996 | Japanese Pat. Off. |
| 06138660 | 05/1994 | Japanese Pat. Off. |

Signed and Sealed this

Seventeenth Day of July, 2007

JON W. DUDAS
*Director of the United States Patent and Trademark Office*